United States Patent
Lin et al.

(10) Patent No.: US 10,946,865 B1
(45) Date of Patent: Mar. 16, 2021

(54) FAULT ISOLATION, PROGNOSIS, AND MITIGATION FOR VEHICLE COMPONENT ELECTRICAL POWER CIRCUIT

(71) Applicant: GM GLOBAL TECHNOLOGY OPERATIONS LLC, Detroit, MI (US)

(72) Inventors: Wen-Chiao Lin, Rochester Hills, MI (US); Xinyu Du, Oakland Township, MI (US); Alexander M. Allan, Howell, MI (US); Robert A. De Stefano, Macomb, MI (US); Xiaofeng Mao, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/601,043

(22) Filed: Oct. 14, 2019

(51) Int. Cl.
| | |
|---|---|
| *B60L 1/00* | (2006.01) |
| *B60L 3/00* | (2019.01) |
| *H02G 3/00* | (2006.01) |
| *B60W 50/02* | (2012.01) |
| *G07C 5/08* | (2006.01) |
| *B60R 16/03* | (2006.01) |
| *G01R 31/50* | (2020.01) |

(52) U.S. Cl.
CPC ......... *B60W 50/0205* (2013.01); *B60R 16/03* (2013.01); *G01R 31/50* (2020.01); *G07C 5/08* (2013.01)

(58) Field of Classification Search
CPC .... B60W 50/0205; G01R 31/50; B60R 16/03; G07C 5/08
USPC ...................................................... 307/10.1
See application file for complete search history.

(56) References Cited

U.S. PATENT DOCUMENTS

| | | |
|---|---|---|
| 9,601,879 B1 | 3/2017 | Lin et al. |
| 10,348,236 B2 | 7/2019 | Lin et al. |
| 2019/0056234 A1 | 2/2019 | Lin et al. |
| 2019/0066406 A1 | 2/2019 | Sarwar et al. |
| 2019/0106115 A1 | 4/2019 | Huang et al. |
| 2019/0176873 A1 | 6/2019 | Lin et al. |

*Primary Examiner* — Richard Tan

(57) ABSTRACT

A power circuit includes a power source and a plurality components that connect the power source to a subsystem of a vehicle. A fault detection module receives voltages at an output of the power source and at an input of the subsystem and current drawn by the subsystem, and distinguishes between a power source failure, a permanent and an intermittent disconnection of one of the components from the power source, and a loose connection between the power circuit and the subsystem or corrosion of one of the components, based on analyses of the voltages and the current. A fault mitigation module mitigates the first two faults by switching to a different power source in the vehicle to supply power to the subsystem, and mitigates the third and fourth faults by reducing the power consumed by the subsystem and by generating a warning regarding the intermittent disconnection or loose connection.

20 Claims, 10 Drawing Sheets

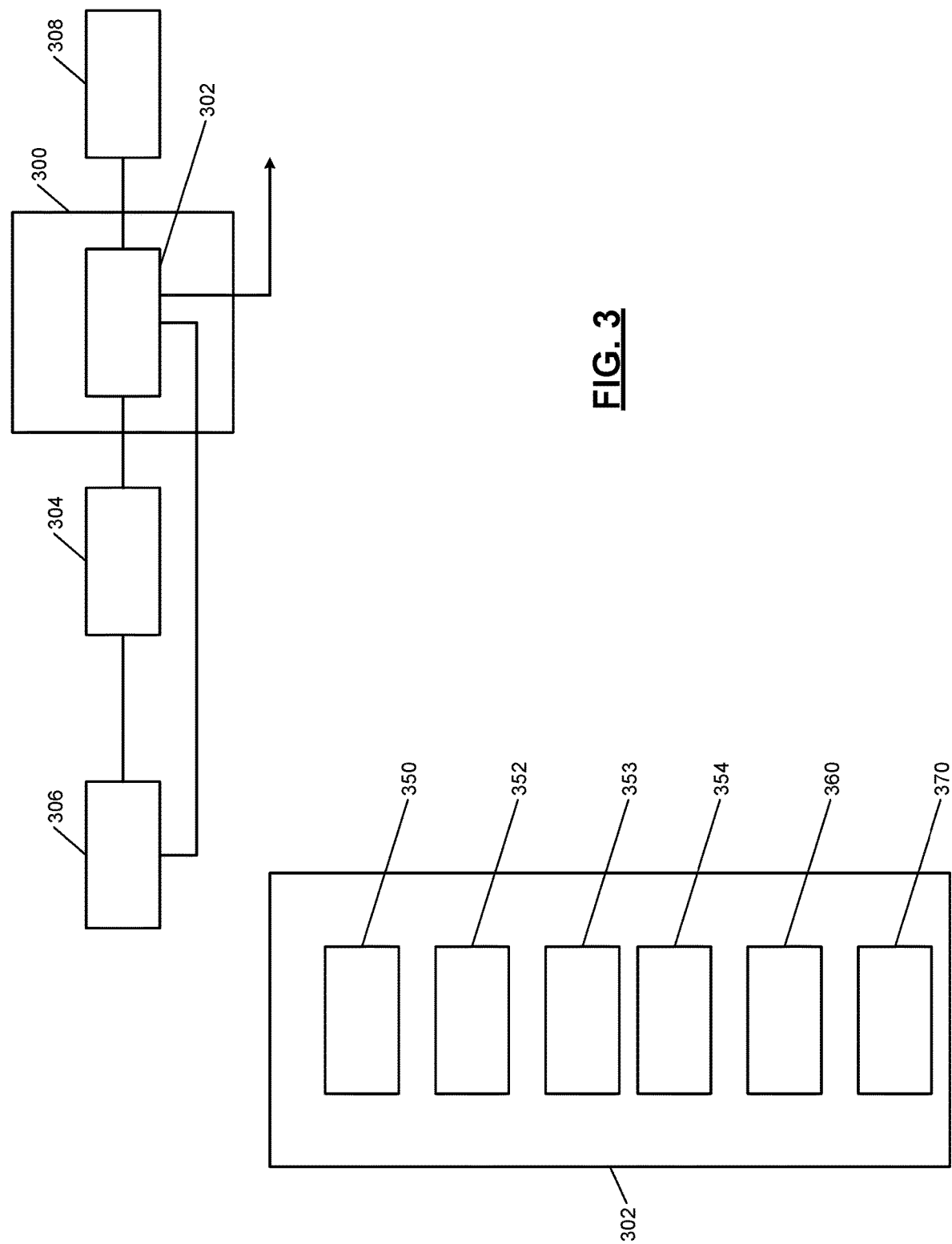

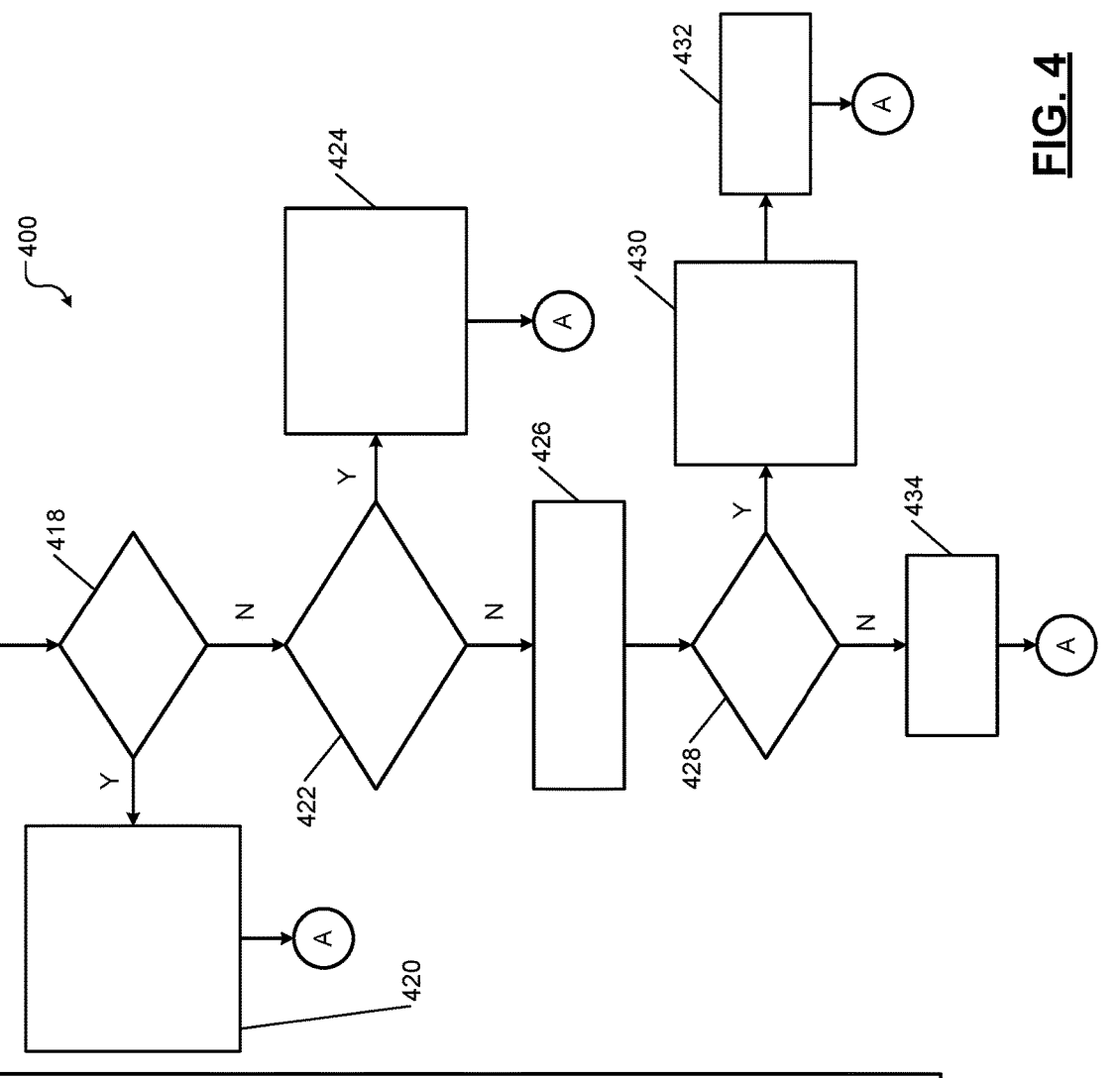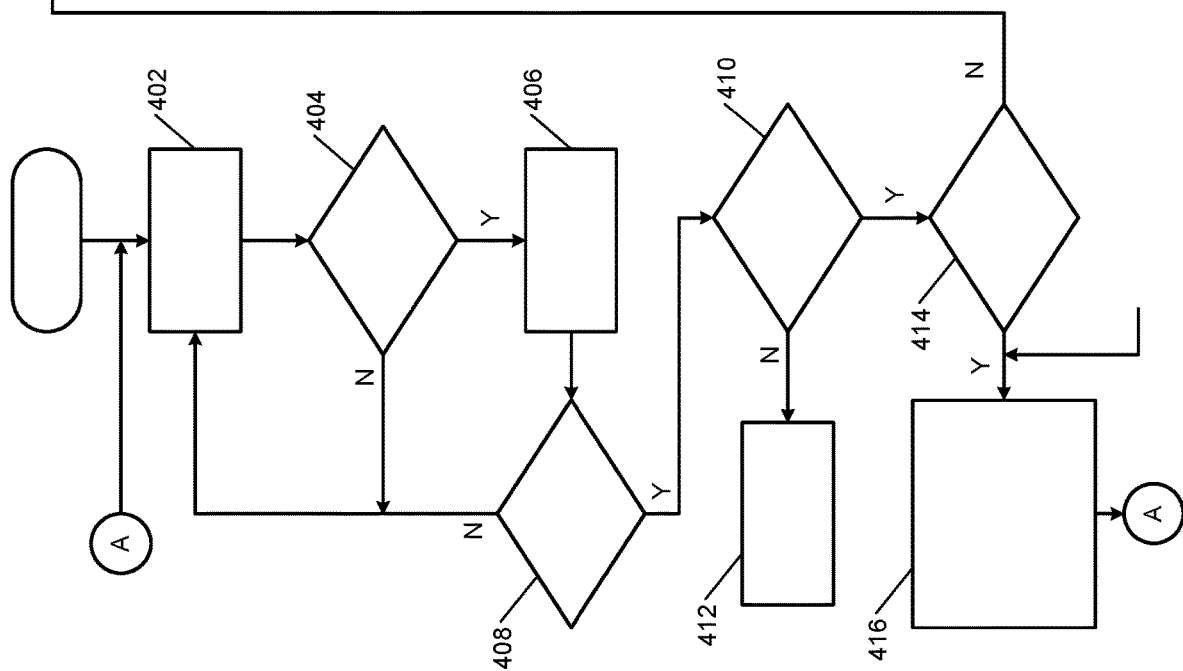
FIG. 4

FAULT ISOLATION, PROGNOSIS, AND MITIGATION FOR VEHICLE COMPONENT ELECTRICAL POWER CIRCUIT

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to electrical power supply systems for vehicles and more particularly to fault isolation, prognosis, and mitigation in electrical power supply systems for vehicles.

Electrical power supply systems provide power to various subsystems (components) of vehicles. Examples of the subsystems include a power steering subsystem, a braking subsystem, a navigation subsystem, an infotainment subsystem, and so on. A power supply system of a vehicle comprises one or more power sources or power supplies (e.g., batteries) and power distribution circuits that distribute the power from the one or more power sources to the various subsystems of the vehicle. For example, the power distribution circuits include fuses, switches, cables, connectors, and so on.

SUMMARY

A system comprises a fault detection module and a fault mitigation module. The fault detection module is configured to communicate with a power circuit supplying power to a subsystem of a vehicle. The power circuit comprises a power source and a plurality components that connect the power source to the subsystem. The fault detection module is configured to receive N sets of measurements from the power circuit and the subsystem, where N is an integer greater than 1. Each set of the N sets includes voltages at an output of the power source and at an input of the subsystem. The fault detection module is configured to detect a first fault indicating a power source failure based on the voltage at the output of the power source. The fault detection module is configured to detect a second fault indicating a permanent disconnection of one of the components from the power source based on a difference between the voltages at the output of the power source and at the input of the subsystem being greater than a first threshold for all the N sets. The fault detection module is configured to detect a third fault indicating an intermittent disconnection of one of the components from the power source based on the difference being greater than a second threshold for M of the N sets, where $1 \leq M < N$. The fault mitigation module is configured to mitigate the first and second faults by switching to a different power source in the vehicle to supply power to the subsystem. The fault mitigation module is configured to mitigate the third fault by reducing the power consumed by the subsystem and by generating a warning regarding the intermittent disconnection.

In other features, each set of the N sets further includes current drawn by the subsystem from the power source. The fault detection module is configured to receive a measurement of a parameter associated with at least one of the power circuit and the subsystem. The parameter is different than the voltages and current. The fault detection module is configured to determine a resistance of the power circuit based on the voltages and current. The fault detection module is configured to normalize the resistance based on the parameter. The fault detection module is configured to detect, based on the normalized resistance, a fourth fault indicating a loose connection between the power circuit and the subsystem or indicating corrosion of one of the components. The fault mitigation module is configured to mitigate the fourth fault by reducing the power consumed by the subsystem and by generating a warning regarding the loose connection or corrosion.

In other features, the fault detection module is further configured to receive data regarding at least one of an output current and a state of health of the power source. The fault detection module is further configured to detect the first fault faster based on the data than based on the voltage at the output of the power source.

In other features, the system further comprises a second fault detection module configured to communicate with a second power circuit supplying power to a second subsystem of the vehicle. The second power circuit comprises a second power source and a plurality of second components that connect the second power source to the second subsystem. The fault mitigation module is configured to, in response to the second fault detection module detecting no fault in the second power circuit, and in response to the fault detection module detecting the first, second, or third fault: mitigate the first, second, or third fault by switching the subsystem to receive power from the second power circuit.

In other features, the system further comprises a second fault detection module configured to communicate with a second power circuit supplying power to a second subsystem of the vehicle. The second power circuit comprises a second power source and a plurality of second components that connect the second power source to the second subsystem. The second fault detection module is configured to detect a fourth fault indicating a loose connection between the second power circuit and the second subsystem or indicating corrosion of one of the second components. The fault mitigation module is configured to, in response to the second fault detection module detecting the fourth fault, and in response to the fault detection module detecting the first, second, or third fault: mitigate the first, second, or third fault and mitigate the fourth fault by switching the subsystem to receive power from the second power circuit, by reducing the power consumed by the subsystem, and by generating a warning regarding the loose connection between the second power circuit and the second subsystem or regarding corrosion of one of the second components.

In other features, the system further comprises a second fault detection module configured to communicate with a second power circuit supplying power to a second subsystem of the vehicle. The second power circuit comprises a second power source and a plurality of second components that connect the second power source to the second subsystem. The second fault detection module is configured to detect a fourth fault indicating a second power source failure, a permanent disconnection between the second power circuit and the second subsystem, or an intermittent disconnection between the second power circuit and the second subsystem. The fault mitigation module is configured to, in response to the second fault detection module detecting the fourth fault, and in response to the fault detection module detecting the first, second, or third fault: mitigate the first, second, or third fault and mitigate the fourth fault by switching the subsystem or the second subsystem to receive power from a third power source in the vehicle.

In other features, the system further comprises a second fault detection module configured to communicate with a second power circuit supplying power to a second subsystem of the vehicle. The second power circuit comprises a second power source and a plurality of second components that connect the second power source to the second subsystem. The second fault detection module is configured to detect a fourth fault indicating a second power source failure, a permanent disconnection between the second power circuit and the second subsystem, or an intermittent disconnection between the second power circuit and the second subsystem. The fault mitigation module is configured to, in response to the second fault detection module detecting the fourth fault, and in response to the fault detection module detecting the first, second, or third fault: mitigate the first, second, or third fault and mitigate the fourth fault by switching operation of the vehicle to a third subsystem and using the third subsystem to pullover the vehicle to roadside.

In other features, the system further comprises a second fault detection module configured to communicate with a second power circuit supplying power to a second subsystem of the vehicle. The second power circuit comprises a second power source and a plurality of second components that connect the second power source to the second subsystem. The second fault detection module is configured to detect a fifth fault indicating a loose connection between the second power circuit and the second subsystem or indicating corrosion of one of the second components. The fault mitigation module is configured to, in response to the second fault detection module detecting no fault in the second power circuit and in response to the fault detection module detecting the fourth fault, or in response to the second fault detection module detecting the fifth fault and the fault detection module detecting the fourth fault: mitigate at least one of the fourth and fifth faults by reducing the power consumed by at least one of the subsystem and the second subsystem and by generating a warning regarding the loose connection or corrosion associated with at least one of the subsystem and the second subsystem.

In other features, the system further comprises a plurality of voltage sensors configured to sense the voltages, a current sensor configured to sense the current, and a validation module configured to determine whether values of the voltages and current in each set are valid. The fault detection module is configured to determine whether one or more of the voltage and current sensors are faulty based on determining whether the values of the voltages and current in each set are valid. The fault detection module is configured to detect the first, second, third, or fourth fault in response to determining that the values of the voltages and current in each set are valid.

In other features, the parameter includes at least one of temperature and humidity associated with at least one of the power circuit and the subsystem.

In still other features, a method comprises receiving N sets of measurements from a power circuit comprising a power source supplying power via a plurality of components to a subsystem of a vehicle, where N is an integer greater than 1. Each set of the N sets includes voltages at an output of the power source and at an input of the subsystem. The method further comprises detecting a first fault indicating a power source failure based on the voltage at the output of the power source. The method further comprises detecting a second fault indicating a permanent disconnection of one of the components from the power source based on a difference between the voltages at the output of the power source and at the input of the subsystem being greater than a first threshold for all the N sets. The method further comprises detecting a third fault indicating an intermittent disconnection of one of the components from the power source based on the difference being greater than a second threshold for M of the N sets, where $1 \leq M < N$. The method further comprises mitigating the first and second faults by switching to a different power source in the vehicle to supply power to the subsystem. The method further comprises mitigating the third fault by reducing the power consumed by the subsystem and by generating a warning regarding the intermittent disconnection.

In other features, each set of the N sets further includes current drawn by the subsystem from the power source. The method further comprises receiving a measurement of a parameter associated with at least one of the power circuit and the subsystem. The parameter is different than the voltages and current. The method further comprises determining a resistance of the power circuit based on the voltages and current and normalizing the resistance based on the parameter. The method further comprises detecting, based on the normalized resistance, a fourth fault indicating a loose connection between the power circuit and the subsystem or indicating corrosion of one of the components. The method further comprises mitigating the fourth fault by reducing the power consumed by the subsystem and by generating a warning regarding the loose connection or corrosion.

In other features, the method further comprises receiving data regarding at least one of an output current and a state of health of the power source, and detecting the first fault faster based on the data than based on the voltage at the output of the power source.

In other features, the method further comprises communicating with a second power circuit comprising a second power source supplying power via a plurality of second components to a second subsystem of the vehicle. The method further comprises, in response to detecting no fault in the second power circuit, and in response to detecting the first, second, or third fault: mitigating the first, second, or third fault by switching the subsystem to receive power from the second power circuit.

In other features, the method further comprises communicating with a second power circuit comprising a second power source supplying power via a plurality of second components to a second subsystem of the vehicle. The method further comprises detecting a fourth fault indicating a loose connection between the second power circuit and the second subsystem or indicating corrosion of one of the second components. The method further comprises, in response to detecting the fourth fault, and in response to detecting the first, second, or third fault: mitigating the first, second, or third fault and mitigate the fourth fault by switching the subsystem to receive power from the second power circuit, by reducing the power consumed by the subsystem, and by generating a warning regarding the loose connection between the second power circuit and the second subsystem or regarding corrosion of one of the second components.

In other features, the method further comprises communicating with a second power circuit comprising a second power source supplying power via a plurality of second components to a second subsystem of the vehicle. The method further comprises detecting a fourth fault indicating a second power source failure, a permanent disconnection between the second power circuit and the second subsystem, or an intermittent disconnection between the second power circuit and the second subsystem. The method further comprises, in response to detecting the fourth fault, and in response to detecting the first, second, or third fault: mitigating the first, second, or third fault and mitigate the fourth fault by switching the subsystem or the second subsystem to receive power from a third power source in the vehicle.

In other features, the method further comprises communicating with a second power circuit comprising a second power source supplying power via a plurality of second components to a second subsystem of the vehicle. The method further comprises detecting a fourth fault indicating a second power source failure, a permanent disconnection between the second power circuit and the second subsystem, or an intermittent disconnection between the second power circuit and the second subsystem. The method further comprises, in response to detecting the fourth fault, and in response to detecting the first, second, or third fault: mitigating the first, second, or third fault and mitigate the fourth fault by switching operation of the vehicle to a third subsystem and using the third subsystem to pullover the vehicle to roadside.

In other features, the method further comprises communicating with a second power circuit comprising a second power source supplying power via a plurality of second components to a second subsystem of the vehicle. The method further comprises detecting a fifth fault indicating a loose connection between the second power circuit and the second subsystem or indicating corrosion of one of the second components. The method further comprises, in response to detecting no fault in the second power circuit and in response to detecting the fourth fault, or in response to detecting the fifth fault and detecting the fourth fault: mitigating at least one of the fourth and fifth faults by reducing the power consumed by at least one of the subsystem and the second subsystem and by generating a warning regarding the loose connection or corrosion associated with at least one of the subsystem and the second subsystem.

In other features, the method further comprises determining whether values of the voltages and current in each set are valid. The method further comprises determining whether one or more of the voltage and current sensors are faulty based on determining whether the values of the voltages and current in each set are valid. The method further comprises detecting the first, second, third, or fourth fault in response to determining that the values of the voltages and current in each set are valid.

In other features of the method, the parameter includes at least one of temperature and humidity associated with at least one of the power circuit and the subsystem.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 shows an example of connections between a fault detection module and a power distribution circuit, a power source, and a subsystem of a vehicle according to the present disclosure;

FIG. 4 shows a flowchart of a method for fault isolation and prognosis according to the present disclosure;

In the drawings, reference numbers may be reused to identify similar and/or identical elements.

DETAILED DESCRIPTION

One or more elements of the power supply system of the vehicle can develop intermittent problems, can degrade, or can fail over time. Sometimes the failures may be due to issues with connections between the various elements of the power supply system. For example, the failures can include a failed power source, a disconnected power source, an intermittent disconnection of the power source, or a loose connection between a connector and the power source. The present disclosure provides systems and methods for fault isolation, prognosis, and mitigation for these failures. These systems and methods pinpoint faulty elements, predict failures, and mitigate the impact of failures on the operability of vehicles.

Current failure detection methods check voltage differences between battery terminals and components (e.g., subsystems) of a vehicle. A simple voltage check, however, may not accurately indicate issues with power circuits. Further, the present diagnostics systems simply provide a pass/fail assessment based on a voltage range and do not isolate the fault location. Furthermore, these methods do not provide early warnings for these failures or isolation for power circuit faults.

The present disclosure provides systems and methods that use not only voltage difference but also current supplied to (or drawn by) the vehicle component (e.g., a subsystem) to provide power circuit fault isolation, prognosis, and mitigation, including early warning for loose power connections. Specifically, the systems and methods isolate power circuit faults including power source failure, permanent power source disconnection, intermittent power source disconnection, and loose power source connection for a vehicle component connected to a power source. The systems and methods can distinguish between these fault conditions of varying severity and can mitigate faults in a hierarchical manner. Additionally, the systems and methods utilize available signals for fault isolation and utilize available power sources for fault mitigation. Further, the systems and methods provide early warnings for loose power connections based on resistance estimations.

Furthermore, the systems and methods provide strategies for fault mitigation when any of these fault conditions are detected or predicted. Specifically, the systems and methods provide an electrical architecture for fault mitigation upon power circuit failures. The electrical architecture leverages redundant power sources available in autonomous vehicles for fault mitigation upon detecting or predicting power circuit failures. These and other features of the present disclosure are described below in detail.

Figure 1A:
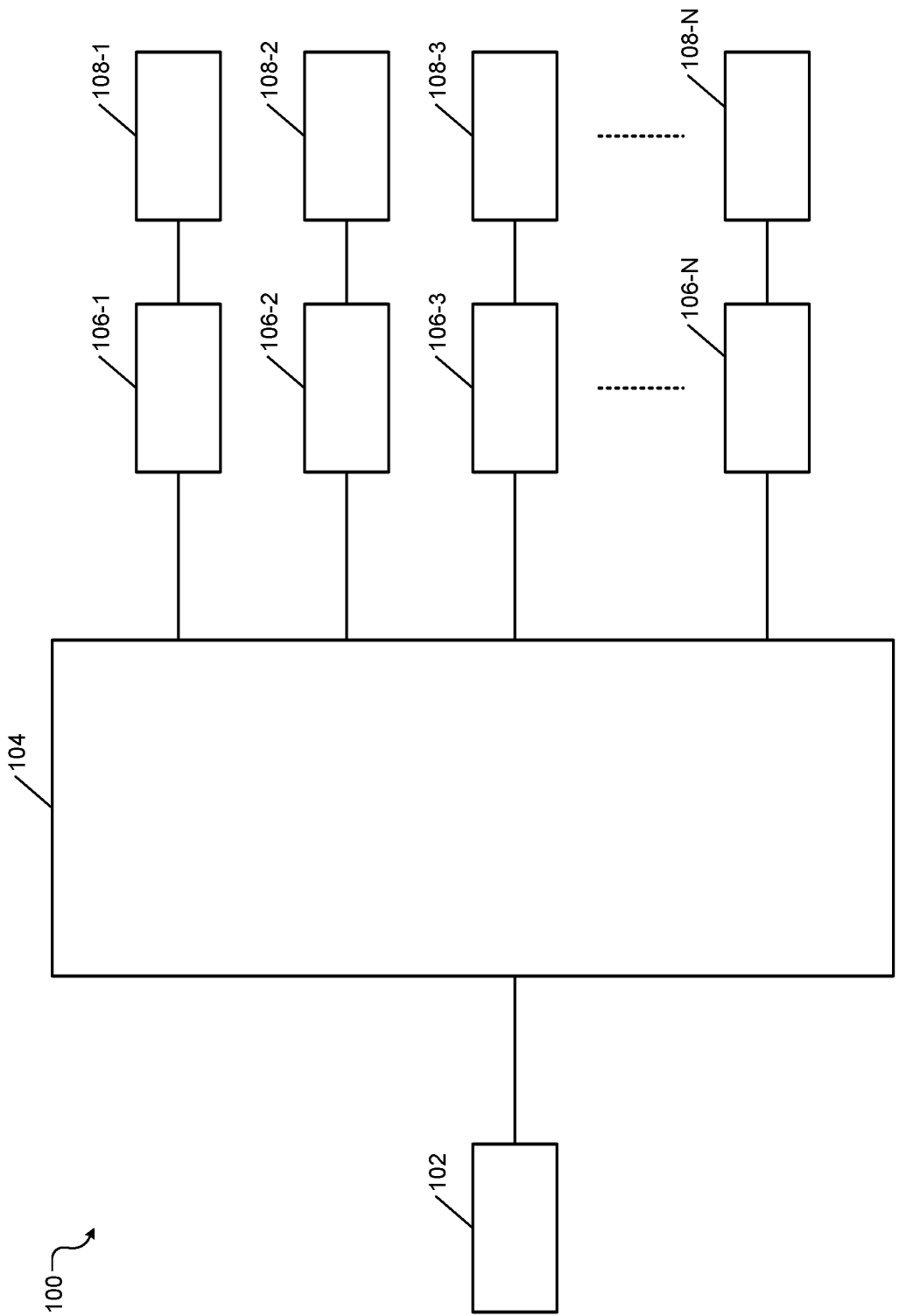
FIG. 1A shows an example of an electrical power supply system of a vehicle including a single power source.
Figure 1B:
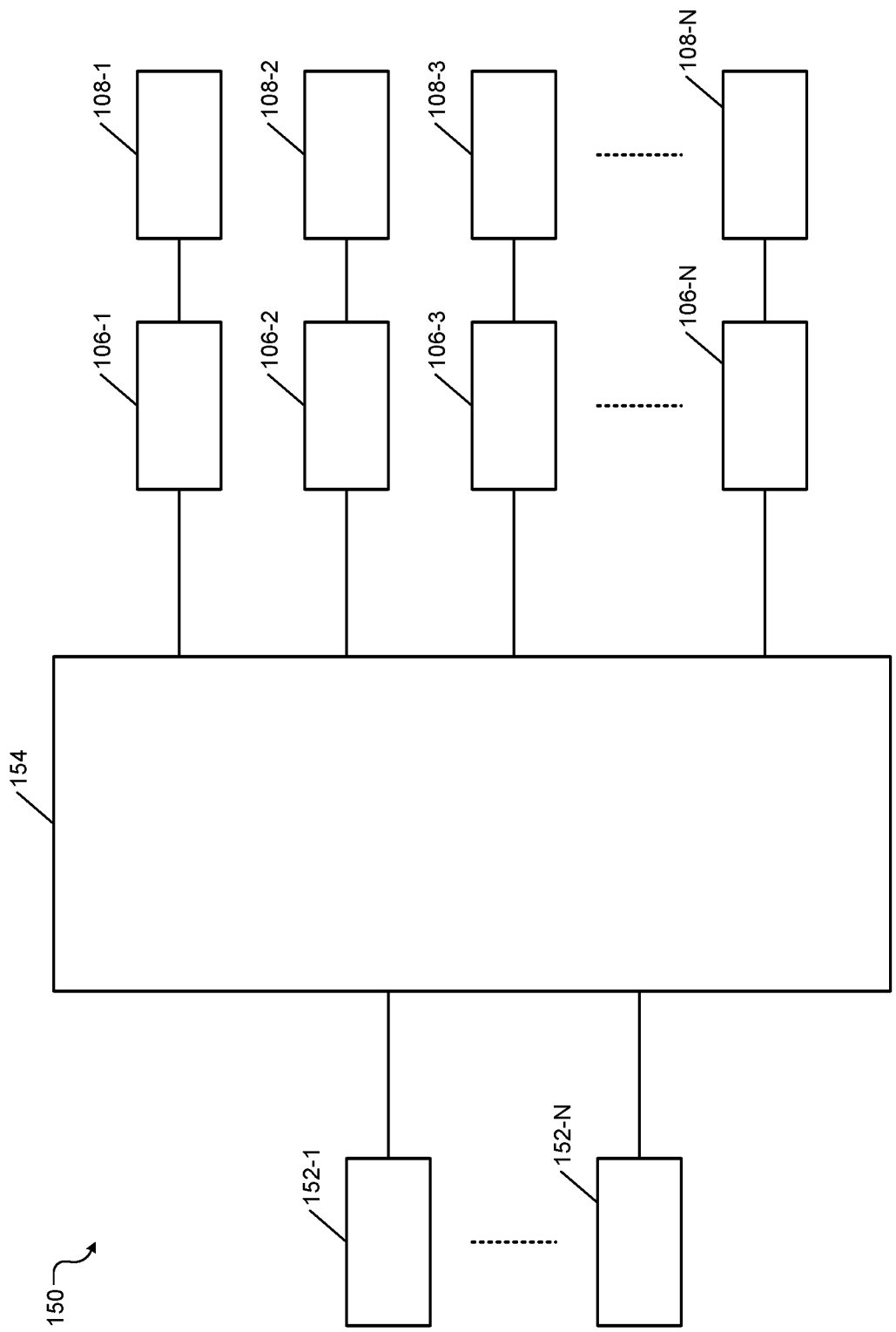
FIG. 1B shows an example of an electrical power supply system of a vehicle including multiple power sources.
Figure 2A:
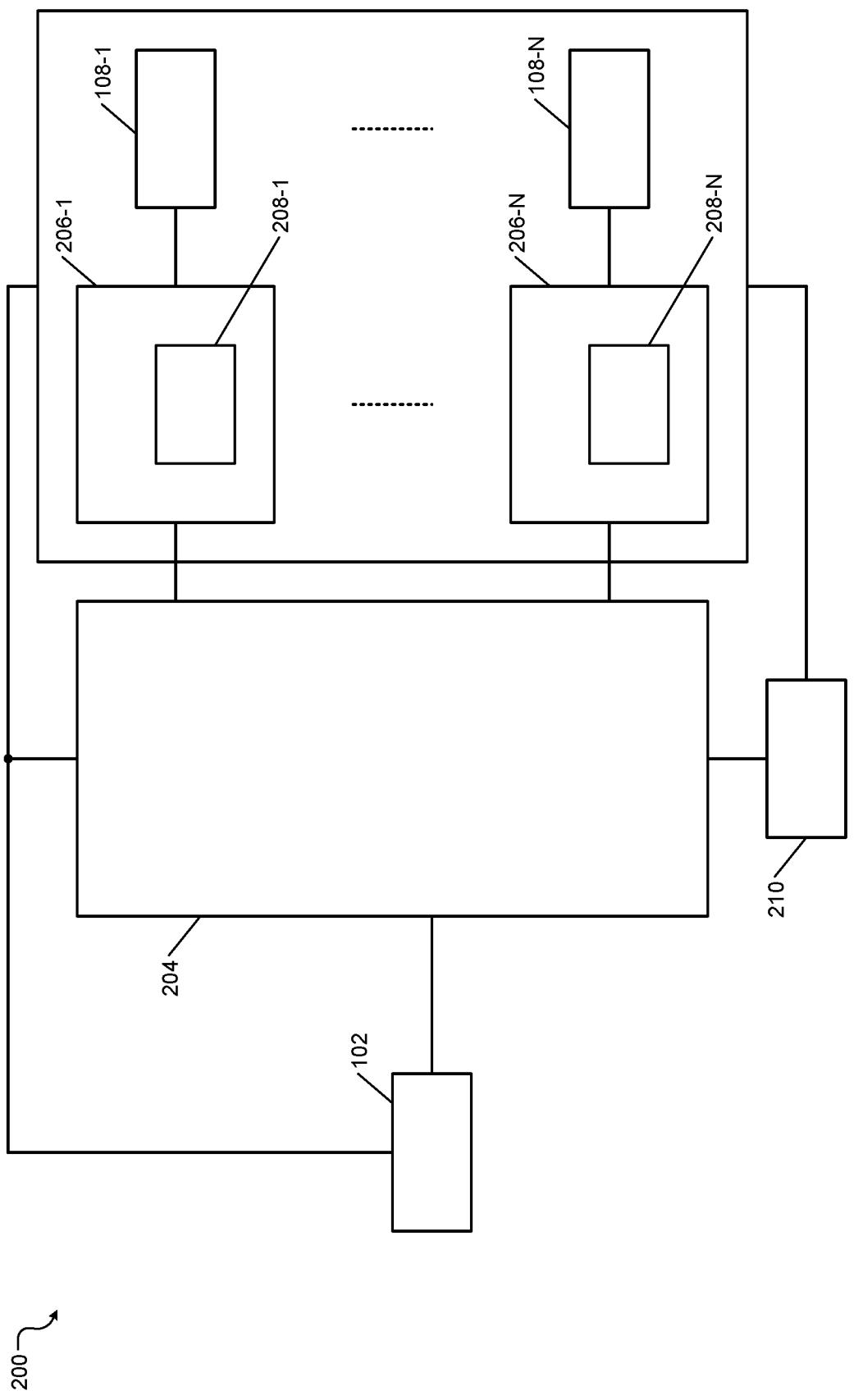
FIG. 2A shows an example of an electrical power supply system of a vehicle including a single power source and including fault detection modules according to the present disclosure.
Figure 2B:
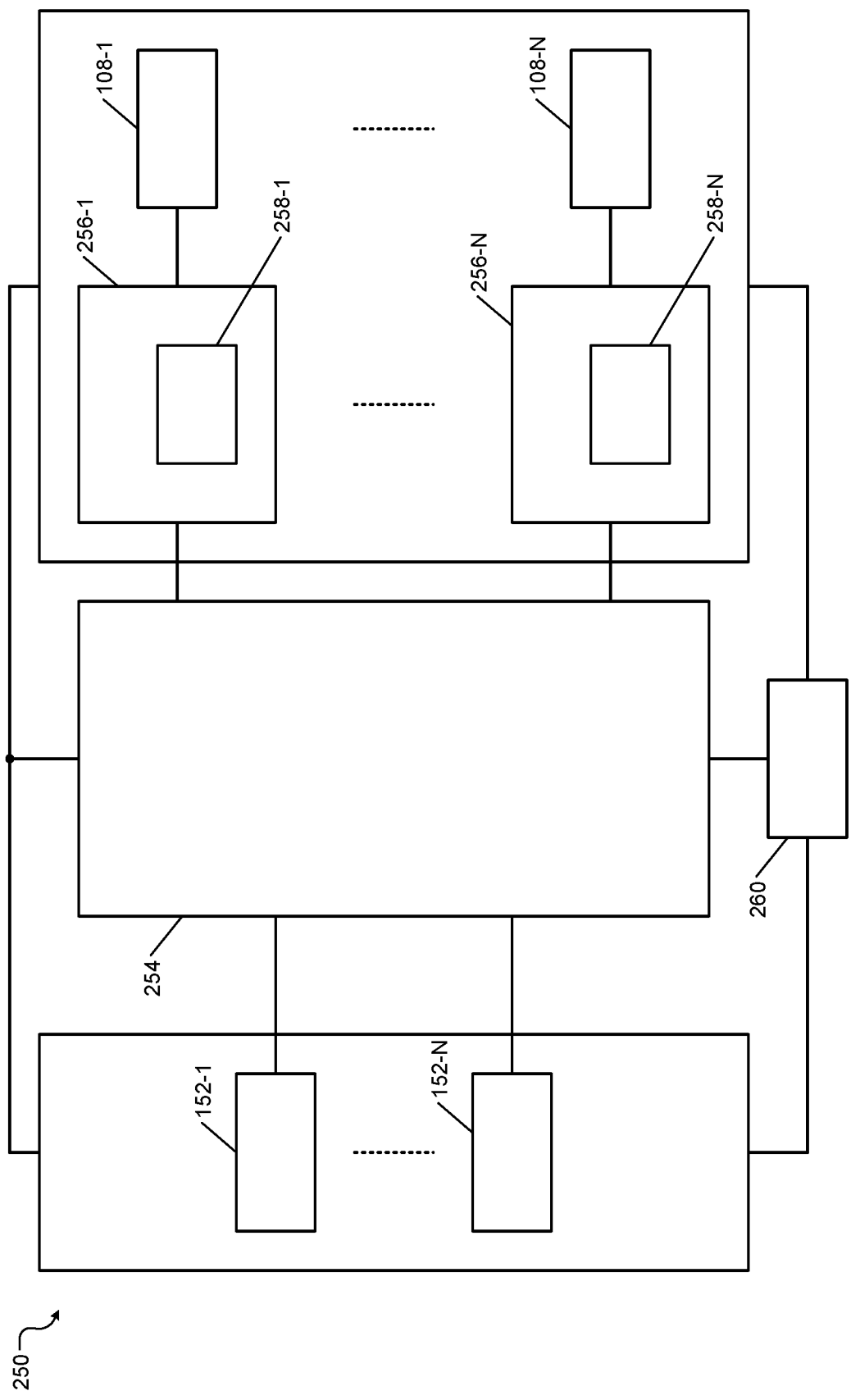
FIG. 2B shows an example of an electrical power supply system of a vehicle including multiple power sources and including fault detection modules according to the present disclosure.
Figure 5:
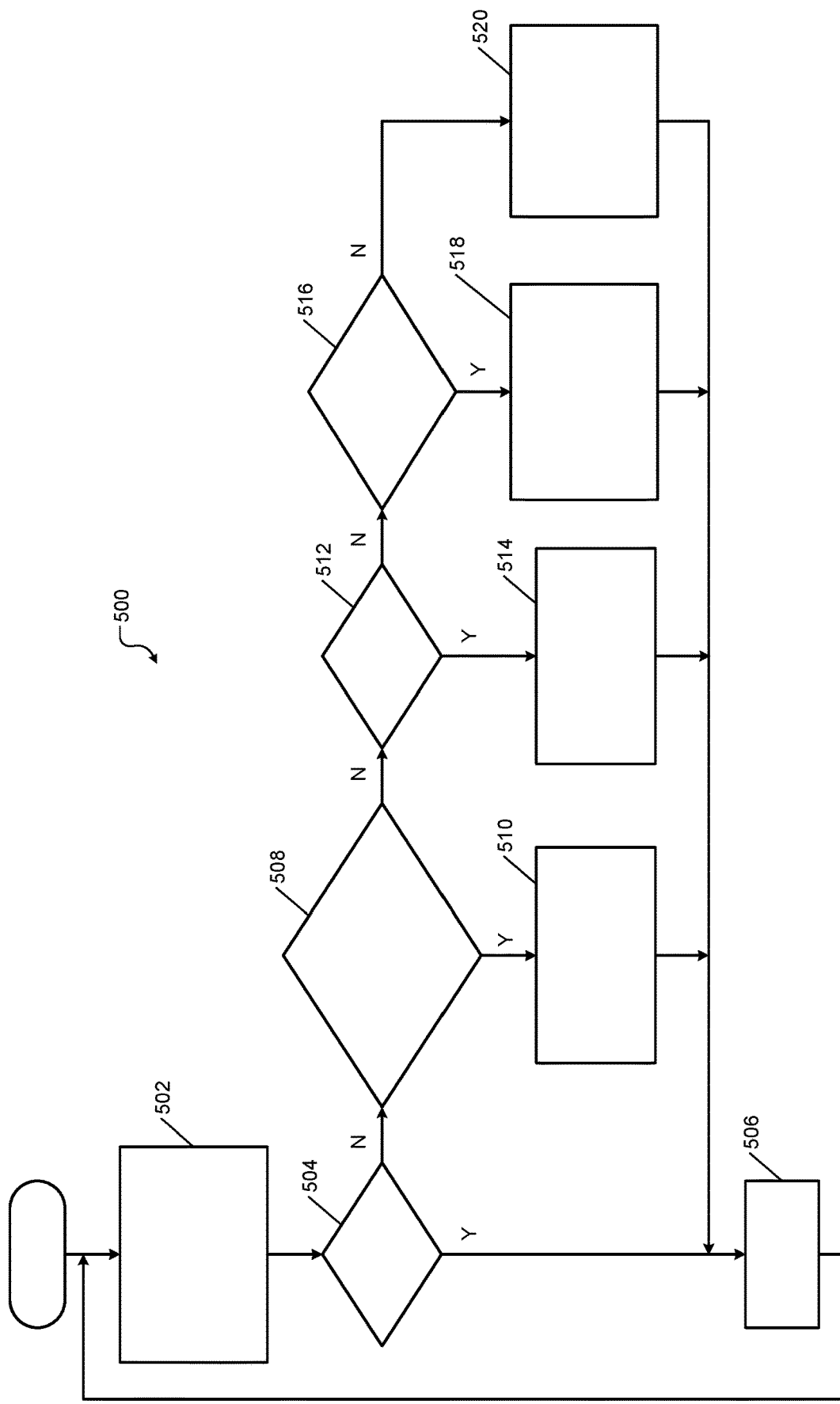
FIG. 5 shows a flowchart of a method for fault mitigation upon fault isolation and prognosis according to the present disclosure.
Figure 6:
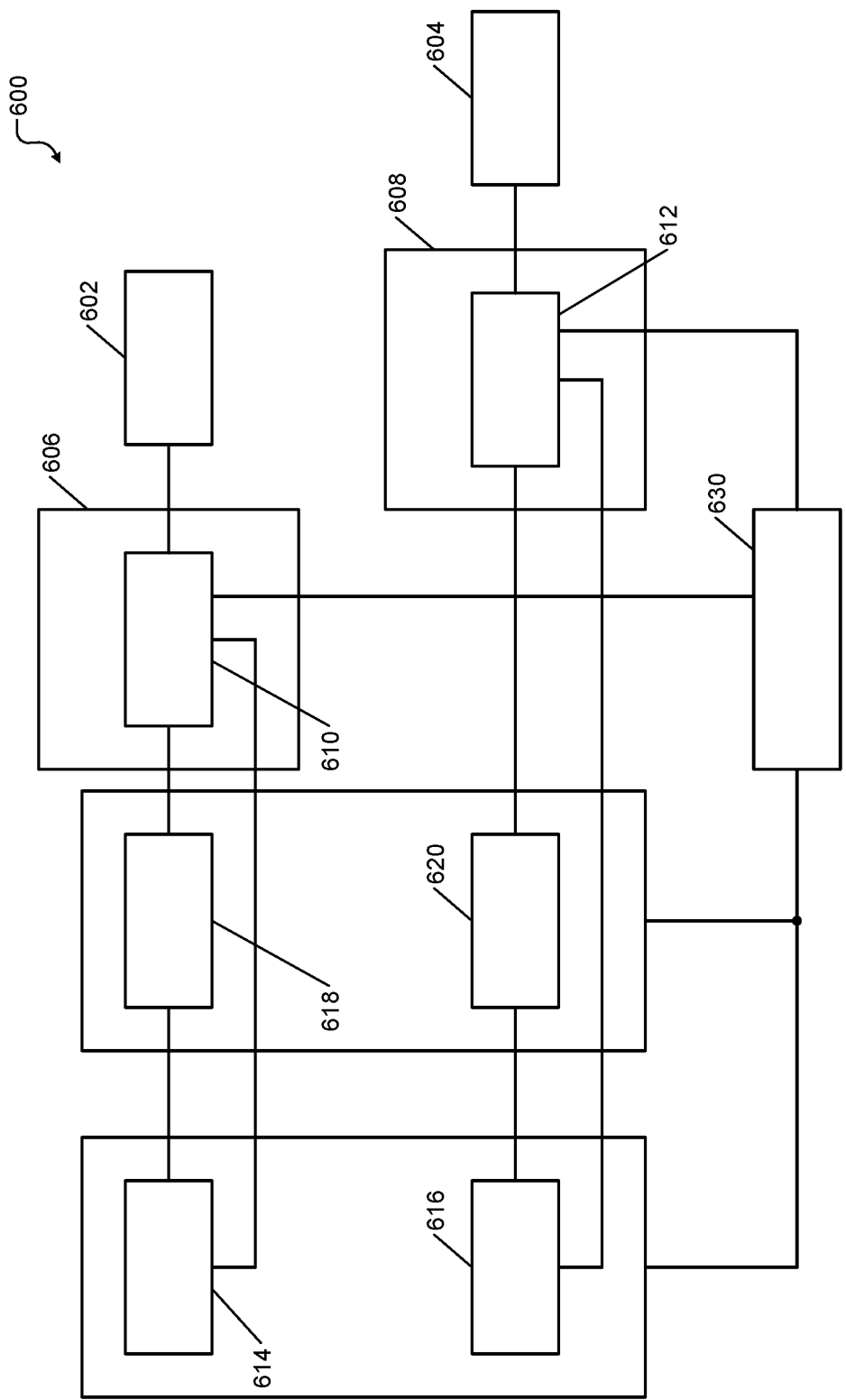
FIG. 6 shows an example of a system that can isolate and mitigate faults in redundant subsystems of a vehicle using the methods of FIGS. 4 and 5.
Figure 7:
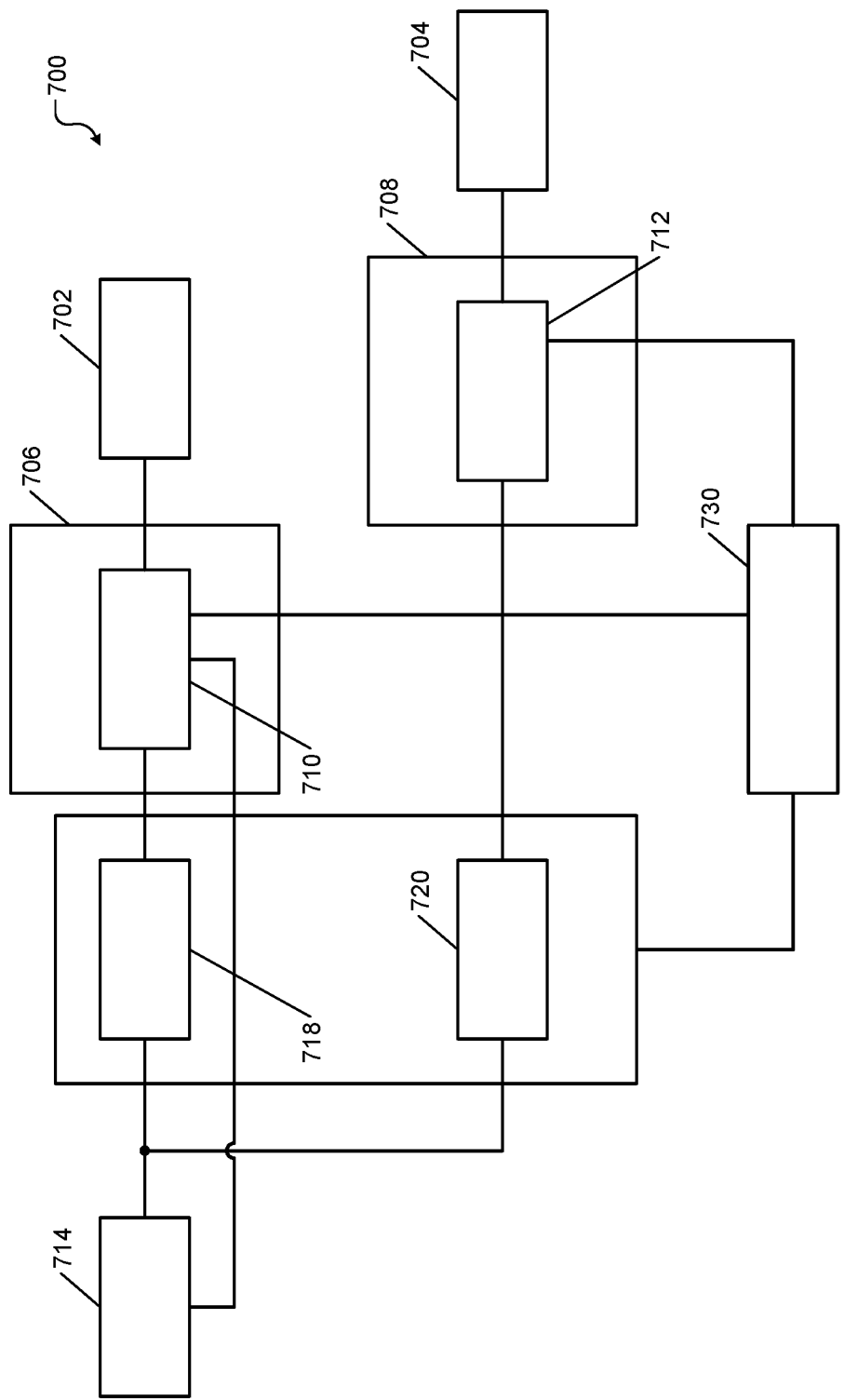
FIG. 7 shows an example of a system that can isolate and mitigate faults in subsystems powered by a single power source in a vehicle using the methods of FIGS. 4 and 5.

The present disclosure is organized as follows. FIGS. 1A and 1B show electrical power supply systems of a vehicle including single and multiple power sources, respectively. FIGS. 2A and 2B show electrical power supply systems of a vehicle including single and multiple power sources, respectively, and including fault detection modules according to the present disclosure. FIG. 3 shows an example of connections between a fault detection module and a power distribution circuit, a power source, and a subsystem of a vehicle. FIG. 4 shows a method for fault isolation and prognosis according to the present disclosure. FIG. 5 shows a method for fault mitigation upon fault isolation and prognosis according to the present disclosure. FIG. 6 shows an example of a system that can isolate and mitigate faults in redundant subsystems of a vehicle using the methods shown in FIGS. 4 and 5. An example implementation of the system of FIG. 6 is shown and described with reference to FIG. 8. FIG. 7 shows an example of a system that can isolate and mitigate faults in subsystems of a vehicle that are powered by a single power source using the methods shown in FIGS. 4 and 5. An example implementation of the system of FIG. 7 is shown and described with reference to FIG. 9. Throughout the present disclosure, N is an integer greater than 1.

FIG. 1A shows an electrical power supply system (hereinafter the system) 100 of a vehicle. The system 100 comprises a power source (e.g., a battery) 102 and power distribution circuits 104. The power distribution circuits 104 include fuse boxes, switches, cables, and connectors. The power source 102 supplies power to a plurality of subsystem control modules controlling respective subsystems of the vehicle. The plurality of subsystem control modules are shown as elements 106-1, 106-2, . . . , and 106-N (collectively called the subsystem control modules 106). The plurality of subsystems are shown as elements 108-1, 108-2, . . . , and 108-N (collectively called the subsystems 108). The power distribution circuits 104 connect the power source 102 to the subsystem control modules 106.

FIG. 1B shows an electrical power supply system (hereinafter the system) 150 of a vehicle. The system 150 comprises a plurality of power sources (e.g., batteries) 152-1, . . . , and 152-N (collectively called power sources 152). The system 150 comprises power distribution circuits 154. The power distribution circuits 154 include fuse boxes, switches, cables, and connectors. The power sources 152 supply power to the subsystem control modules 106 controlling the respective subsystems 108 of the vehicle. The power distribution circuits 154 connect the power source 152 to the subsystem control modules 106.

FIG. 2A shows an electrical power supply system (hereinafter the system) 200 of a vehicle. The system 200 comprises the power source (e.g., a battery) 102 and power distribution circuits 204. The power distribution circuits 204 include fuse boxes, switches, cables, and connectors. The power source 102 supplies power to a plurality of subsystem control modules controlling the respective subsystems 108 of the vehicle. The plurality of subsystem control modules are shown as elements 206-1, 206-2, . . . , and 206-N (collectively called the subsystem control modules 206).

The subsystem control modules 206 respectively include a plurality of fault detection modules 208-1, 208-2, . . . , and 208-N (collectively called the fault detection modules 208). The fault detection modules 208 perform fault detection, which includes fault isolation, prognosis, and warning as explained with reference to FIGS. 3 and 4 below. The power distribution circuits 204 connect the power source 102 to the subsystem control modules 206. The fault detection modules 208 are connected to the power distribution circuits 204 and the power source 102.

The system 200 further comprises a fault mitigation module 210 that mitigates fault conditions detected by the fault detection modules 208. The fault mitigation module 210 is connected to the fault detection modules 208 and the power distribution circuits 204. The fault mitigation module 210 mitigates the fault conditions as described with reference to FIGS. 5, 7, and 9 below.

FIG. 2B shows an electrical power supply system (hereinafter the system) 250 of a vehicle. The system 250 comprises the power sources (e.g., batteries) 152 and power distribution circuits 254. The power distribution circuits 254 include fuse boxes, switches, cables, and connectors. The power sources 152 supply power to a plurality of subsystem control modules controlling the respective subsystems 108 of the vehicle. The plurality of subsystem control modules are shown as elements 256-1, 256-2, . . . , and 256-N (collectively called the subsystem control modules 256).

The subsystem control modules 256 respectively include a plurality of fault detection modules 258-1, 258-2, . . . , and 258-N (collectively called the fault detection modules 258). The fault detection modules 258 perform fault detection, which includes fault isolation, prognosis, and warning, as explained with reference to FIGS. 3 and 4 below. The power distribution circuits 254 connect the power sources 152 to the subsystem control modules 256. The fault detection modules 258 are connected to the power distribution circuits 254 and the power sources 152.

The system 250 further comprises a fault mitigation module 260 that mitigates fault conditions detected by the fault detection modules 258. The fault mitigation module 260 is connected to the fault detection modules 258, the power distribution circuits 254, and the power sources 152. The fault mitigation module 260 mitigates the fault conditions as described with reference to FIGS. 5, 6, and 8 below.

FIG. 3 shows an example of connections between a fault detection module and a power distribution circuit, a power source, and a subsystem. For example, a subsystem control module 300 comprises a fault detection module 302 that is connected to a power distribution circuit 304, a power source 306, and a subsystem 308. The power source 306 and the power distribution circuit 304 are collectively called a power circuit that supplies power to the subsystem control module 300 and the subsystem 308.

For example, the subsystem control module 300 can be any of the subsystem control modules 206, 256 shown in FIGS. 2A and 2B. For example, the fault detection module 302 can be any of the fault detection modules 208, 258 shown in FIGS. 2A and 2B. For example, the power distribution circuit 304 can be a portion of any of the power distribution circuits 204, 254 shown in FIGS. 2A and 2B. For example, the power source 306 can be any of the power sources 102, 152 shown in FIGS. 2A and 2B. For example, the subsystem 308 can be any of the subsystems 108 shown in FIGS. 2A and 2B.

The fault detection module 302 comprises voltage sensors 350, current sensors 352, a validation module 353, a resistance measuring module 354, other sensors 360, and a normalizing module 370. The voltage sensors 350 sense voltages at various points. For example, the voltage sensors 350 sense voltages at the output of the power source 306 (e.g., at the positive terminal of the battery) and at the input of the subsystem 308. For example, these voltages are denoted by V1 and V2 respectively in the description of FIG. 4 below. The current sensors 352 sense output current supplied by the power source 306 and input current drawn by the subsystem 308. Either current is denoted by I in the description of FIG. 4 below.

The validation module 353 determines rationality of the voltage and current measurements (i.e., whether the voltage and current measurements are reliable). For example, the validation module 353 determines whether V1 is greater than V2. The measurements of V1 and V2 are valid or rational if V1 is greater than or equal to V2. The validation module 353 determines whether current I is negative, in which case the current measurement is invalid. The measurements found invalid can be discarded from consideration in the fault isolation method described with reference to FIG. 4 below.

The resistance measuring module 354 measures the resistance of the power circuit (i.e., the power source 306 and the power distribution circuit 304) based on the voltage and current measurements. The fault detection module 302 can detect increases in resistance values. For example, these increases can be due to corrosion of various electrical contacts in the power circuits (e.g., at battery terminals, connector ends, exposed conductors of cables, and so on). Variations in the resistances can be due to intermittent contact problems between cables and connectors. For example, the resistance values can increase when a connection is broken. The fault detection module 302 can isolate faults in the power circuit based on the variations in resistance values as described with reference to FIG. 4 below.

Further, the fault detection module 302 can predict faults based on the variations in resistance values as described with reference to FIG. 4 below. For example, rapid variations in resistance values can indicate that an intermittent connection, which is causing the rapid variations in resistance values, may soon break permanently and can cause a disconnection problem. An alert message or a warning can be proactively issued, and the disconnection problem can be prevented if remedial actions are timely performed to correct the intermittent connection.

As another example, gradual increase in resistance values can indicate that a corroding connection, which may be causing the gradual increase in resistance values, may soon become intermittent or break permanently and can cause a disconnection problem. An alert message or a warning can be proactively issued, and the disconnection problem can be prevented if remedial actions are timely performed to correct the corrosion problem.

The other sensors 360 can include sensors that measure environmental factors surrounding the power circuit. For example, the other sensors 360 may include a temperature sensor that measures temperature of the power circuit; a humidity sensor that measures humidity around the power circuit (which can corrode electrical contacts), and so on. For example, the other sensors 360 may further comprise vibration sensors, stress and strain gauges, and so on. These sensors can detect other factors such as harshness of environment surrounding the power circuit. All of these factors can adversely affect connections between the power source 306 and the various elements of the power distribution circuit 304 such as fuses, switches, cables, connectors, and so on. The fault detection module 302 can determine the condition of these connections and can isolate faults in the power circuit as described with reference to FIG. 4 below.

The normalizing module 370 normalizes the voltage, current, and resistance measurements using data from the other sensors 360. Further, the fault detection module 302 can determine the state of health (SOH) of the power source 306 based on the voltage, current, and resistance measurements. The fault detection module 302 can use the SOH of the power source 306 as a factor in isolating faults in the power circuit as described with reference to FIG. 4 below.

The fault detection module 302 may generate warnings or alerts regarding predicted and isolated faults in the power circuit as described with reference to FIG. 4 below. These warnings or alerts can be output via the infotainment subsystem of the vehicle. For example, the warnings or alerts can be output as audio indications via a speaker system of the infotainment subsystem and/or as visual indications via a display system of the infotainment subsystem.

FIG. 4 shows a method 400 for fault isolation and prognosis according to the present disclosure. The method 400 is performed by a subsystem control module (or more specifically by a fault detection module comprised in the subsystem control module) of a subsystem. For example, the fault detection module 302 of the subsystem control module 300 performs the method 400.

At 402, control waits for time T1. Thereafter, at 404, control determines if intended power to be consumed by the subsystem (e.g., driver torque or steering wheel angle gradient in case of an electrical power steering subsystem) is greater than a first threshold. If the intended power to be consumed by the subsystem is not greater than the first threshold, control returns to 402. If the intended power to be consumed by the subsystem is greater than the first threshold, at 406, control measures voltage V1 at the power source, voltage V2 at the input to the component (e.g., the subsystem) powered by the power source, and current I drawn by the component (e.g., the subsystem) from the power source. Control measures V1, V2, and I using respective sensors (e.g., sensors shown in FIG. 3).

Control collects N sets of these measurements or samples, where N is an integer greater than 1. The number N is determined based on the subsystem. For example, for some subsystems, time may be critical; therefore, N may be relatively small. In some subsystems, high accuracy may be desirable; therefore, N may be relatively large. Accordingly, N may be configurable. At 408, control determines whether the N sets are collected. If the N sets are not yet collected, control returns to 402. Control proceeds to 410 if the N sets are collected.

At 410, control performs a rationality or reliability test for the sensor signals based on which the N sets are collected. For example, for the N sets to be valid, V2 may not be less than V1; the current I may not be negative; and so on. At 412, if the reliability test fails, control indicates a sensor failure, and control returns to 402.

At 414, if the reliability test passes, control determines if V1 is less than a second threshold for M of the N sets, where M is a positive integer less than N. At 416, if V1 is less than a second threshold for M of the N sets or samples, control indicates a power source failure, and uses a fault mitigation method such as using a redundant power source, for example. Control may use data regarding at least one of an output current I and a state of health (SOH) of the power source (received from suitable sensor(s)) for early detection of power source failure (i.e., faster than based on the voltage V1). Further, control may also use additional parameters measured based on signals from other sensors such as temperature of the power circuit and/or the vehicle component, humidity surrounding the power circuit and/or the vehicle component, and so on. These additional parameters are used to normalize the V1, V2, and I measurements. Thereafter, control returns to 402. Control proceeds to 418 if V1 is not less than a second threshold for M of the N sets.

At 418, control determines if the difference between V1 and V2 is greater than a third threshold for all the N sets. At 420, if the difference between V1 and V2 is greater than the third threshold for all the N sets, control indicates a power circuit failure (e.g., a permanent disconnection of the power source), and uses a fault mitigation method such as using a redundant power source, or borrowing power from another power source, for example. At this point, control does not indicate a power source failure, which is already eliminated at 414, 416. Control returns to 402.

At 422, if the difference between V1 and V2 is not greater than the third threshold for all the N sets, control determines if the difference between V1 and V2 is greater than a fourth threshold for at least one but not all of the N sets. At 424, if the difference between V1 and V2 is greater than the fourth threshold for at least one but not all of the N sets, control indicates an intermittent disconnection problem with a power circuit, and uses a fault mitigation method such as reducing power, and provides a warning about the intermittent disconnection problem with the power circuit. At this point, control does not indicate a power source failure, which is already eliminated at 414, 416; and control also does not indicate a power circuit failure, which is already eliminated at 418, 420. Control returns to 402.

At 426, if the difference between V1 and V2 is not greater than the fourth threshold for at least one but not all of the N sets, control calculates resistance of the power circuit. The power circuit includes the power source and power distribution circuit elements (e.g., cables, connectors, etc.) that are used to supply the power from the power source to the vehicle component (e.g., the subsystem). Control calculates the resistance of the power circuit based on V1, V2, and I (e.g., R=(V1–V2)/I). Control also receives measurements of other parameters (e.g., environmental factors) associated with the power circuit such as temperature, humidity, and so on, for example, from respective sensors. Control uses these measurements to normalize the resistance measurement.

At 428, control determines if the resistance is greater than a fifth threshold over a moving window of measurements in the N sets. For example, control uses a least squares calculation over the moving window. Other methods can be used instead of or in addition to the least squares method.

At 430, if the resistance is greater than the fifth threshold, control indicates a loose connection or a corroded connection (since a loose connection or corrosion increases resistance). At 432, control mitigates the fault condition by reducing power output from the power source to the vehicle component. At this point, control does not indicate a power source failure, which is already eliminated at 414, 416; control also does not indicate a power circuit failure, which is already eliminated at 418, 420; and control further does not indicate an intermittent disconnection problem with a power circuit, which is already eliminated at 422, 424. Control returns to 402.

Thus, control is able to hierarchically distinguish between a power source failure, an intermittent disconnection problem with a power circuit, and a loose connection or a corroded connection. Due to the ability to hierarchically distinguish these fault conditions, control is able to apply appropriate mitigation techniques depending on the specific fault condition and also proactively provide warnings about these fault conditions.

At 434, if the resistance is not greater than the fifth threshold, control indicates that the power source and all elements of the power circuit are operating normally without any fault condition (i.e., are healthy), and control returns to 402. The method 400 can be implemented in any subsystem control module that can sense voltages at the power source and the subsystem and that can sense the current drawn from the power source by the subsystem.

FIG. 5 shows a method 500 for fault mitigation upon fault isolation and prognosis according to the present disclosure. The method 500 is performed by the fault mitigation module (e.g., element 260 shown in FIG. 2B). The method 500 is used with redundant subsystems powered by redundant power supply systems that include respective power sources and power distribution circuits. In the following description of FIG. 5, the terms power sources A and B should be respectively understood as power supply systems A and B. The method 500 mitigates faults in increasing order of severity. Thus, the method 500 hierarchically mitigates isolated faults.

In the description below, for example only, two redundant subsystems A and B are respectively powered by two redundant power sources A and B. Of these, subsystem A and its power source A may be considered a primary subsystem used to perform an operation of the vehicle, and subsystem B and its power source B may be considered a secondary subsystem used to perform the operation of the vehicle. The secondary elements (e.g., subsystem B and/or its power source B) are utilized if a fault condition occurs in the primary elements (e.g., in subsystem A and/or its power source A) as follows.

At 502, control checks if a least severe fault condition exists (e.g., control checks for severity level 1). Control determines the health of power sources A and B for redundant subsystems A and B (e.g., using the method 400). At 504, control determines if both power sources A and B are healthy. At 506, if both power sources A and B are healthy, control waits for time T2, and control returns to 502.

At 508, if both power sources A and B are not healthy, control further determines whether one of the two power sources (e.g., power source A) is healthy and the other power source (e.g., power source B) has a loose connector (as determined by the method 400). Alternatively, control determines if both power sources A and B have loose connection issues (as determined by the method 400).

At 510, if one power source is healthy and the other power source has a loose connection fault, or if both power sources have loose connection faults, control issues a warning message or an alert to reduce power to one or both subsystems A and B (i.e., reduce power to subsystem A, subsystem B, or both). Thereafter, control returns to 506.

At 512, if the fault condition is not at the severity level 1, then the fault may be more severe than the severity level 1. Control determines if one of the power sources (e.g., power source A) has a failure (e.g., power source fault, disconnection, or intermittent disconnection condition, as determined by the method 400) and the other power source (e.g., power source B) is healthy. This condition is treated as severity level 2, which is more severe than the severity level 1.

At 514, if one power source has a failure (e.g., power source fault, disconnection, or intermittent disconnection condition, as determined by the method 400) and the other power source is healthy, control switches the power sources/circuits (by leveraging the redundancy of the power sources/circuits). Examples of switching power sources/circuits are shown and described with reference to FIGS. 6 and 8 below. Thereafter, control returns to 506.

At 516, if the fault condition is not at the severity level 2, then the fault may be more severe than the severity level 2. Control determines if one of the power sources (e.g., power source A) has a failure (e.g., power source fault, disconnection, or intermittent disconnection condition, as determined by the method 400) and the other power source (e.g., power source B) has a loose connection. This condition is treated as severity level 3, which is more severe than the severity level 2.

At 518, if one power source has a failure (e.g., power source fault, disconnection, or intermittent disconnection condition, as determined by the method 400) and the other power source has a loose connection, control switches the power sources/circuits (by leveraging the redundancy of the power sources/circuits) and issues a warning message or an alert to reduce power to one or both subsystems A and B (i.e., reduce power to subsystem A, subsystem B, or both). Examples of switching power sources/circuits are shown and described with reference to FIGS. 6 and 8 below. Thereafter, control returns to 506.

At 520, if the fault condition is not at the severity level 3, then the fault may be more severe than the severity level 3. That is, both power sources may have a failure (e.g., power source fault, disconnection, or intermittent disconnection condition, as determined by the method 400). This condition is treated as severity level 4, which is more severe than the severity level 3. Control may use a redundancy feature in the vehicle (e.g., a redundant feature such as differential braking if power steering has failed) to pull over the vehicle to the roadside. Alternatively, control may power subsystem A or B by using power from a power source connected to another subsystem if the power source connected to the other subsystem is healthy (e.g., as determined by the method 400). Thereafter, control returns to 506.

FIG. 6 shows an example of a system 600 that can isolate and mitigate faults in redundant subsystems of a vehicle using the methods 400 and 500 described above. An example implementation of the system 600 is shown and described with reference to FIG. 8 below.

For example, the system 600 comprises two redundant subsystems 602, 604 (respectively shown as subsystems A, B). For example, the subsystems 602, 604 can be any one of the subsystems 108 shown in FIG. 1. The subsystems 602, 604 are controlled by respective subsystem control modules 606, 608. The subsystem control modules 606, 608 respectively comprise fault detection modules 610, 612. The fault detection modules 610, 612 can be similar to the fault detection module 302 shown and described with reference to FIG. 3 above.

The subsystems 602, 604 are powered by two power sources 614, 616. The power sources 614, 616 are respectively connected to the subsystem control modules 606, 608 and the subsystems 602, 604 via respective power distribution circuits 618, 620. For example, the power sources 614, 616 can be similar to the power sources 152 shown in FIG. 2B. For example, the power distribution circuits 618, 620 can include portions of the power distribution circuit 254 shown in FIG. 2B.

The power source 614 and the power distribution circuit 618 is called the power circuit of the subsystem control module 606 and the subsystem 602. The power source 616 and the power distribution circuit 620 is called the power circuit of the subsystem control module 608 and the subsystem 604.

The fault detection module 610 isolates faults in the power circuit of the subsystem control module 606 and the subsystem 602 (i.e., in the power source 614 and the power distribution circuit 618) using the method 400 described with reference to FIG. 4 above. The fault detection module 612 isolates faults in the power circuit of the subsystem control module 608 and the subsystem 604 (i.e., in the power source 616 and the power distribution circuit 620) using the method 400 described with reference to FIG. 4 above.

The fault mitigation module 630 mitigates the isolated faults according to the method 500 described with reference to FIG. 5 above. The subsystems 602, 604 are identical. The subsystem control modules 606, 608 respectively control the subsystems 602, 604 in the same manner so that each of the subsystems 602, 604 performs the same functions. Accordingly, in the event of a failure in the subsystem 602, the subsystem 604 can replace the subsystem 602, and vice a versa. Further, the power sources 614, 616 can be identical. Accordingly, if any fault is detected in the power source 614 and/or the power distribution circuit 618, the fault mitigation module 630 can switch over to the power source 616 and/or the power distribution circuit 620. In other words, the subsystems 602, 604 are redundant.

FIG. 7 shows an example of a system 700 that can isolate and mitigate faults in subsystems of a vehicle that are powered by a single power source by switching/sharing power between two subsystems using the methods 400 and 500 described above. An example implementation of the system 700 is shown and described with reference to FIG. 9 below.

For example, the system 700 comprises two subsystems 702, 704 (respectively shown as subsystems A, B). For example, the subsystems 702, 704 can be any of the subsystems 108 shown in FIG. 1. The subsystems 702, 704 are controlled by respective subsystem control modules 706, 708. The subsystem control modules 706, 708 respectively comprise fault detection modules 710, 712. The fault detection modules 710, 712 can be similar to the fault detection module 302 shown and described with reference to FIG. 3 above.

The subsystems 702, 704 are powered by a single power source 714. The same power source 714 is connected to the subsystem control modules 706, 708 and the subsystems 702, 704 via their respective power distribution circuits 718, 720. For example, the power source 714 can be similar to the power source 102 shown in FIG. 2A. For example, the power distribution circuits 718, 720 can include portions of the power distribution circuit 204 shown in FIG. 2A.

The power source 714 and the power distribution circuit 718 is called the power circuit of the subsystem control module 706 and the subsystem 702. The power source 714 and the power distribution circuit 720 is called the power circuit of the subsystem control module 708 and the subsystem 704.

The fault detection module 710 isolates faults in the power circuit of the subsystem control module 706 and the subsystem 702 (i.e., in the power source 714 and the power distribution circuit 718) using the method 400 described with reference to FIG. 4 above. The fault detection module 712 isolates faults in the power circuit of the subsystem control module 708 and the subsystem 704 (i.e., in the power source 714 and the power distribution circuit 720) using the method 400 described with reference to FIG. 4 above.

The fault mitigation module 730 mitigates the isolated faults according to the method 500 described with reference to FIG. 5 above. For example, if a fault is detected in the power circuit of the subsystem control module 706 and the subsystem 702 (e.g., in the power distribution circuit 718), the fault mitigation module 730 switches the connection of the subsystem control module 706 and the subsystem 702 over to the power circuit of the subsystem control module 708 and the subsystem 704 (i.e., over to the power distribution circuit 720), and vice a versa.

Figure 8:
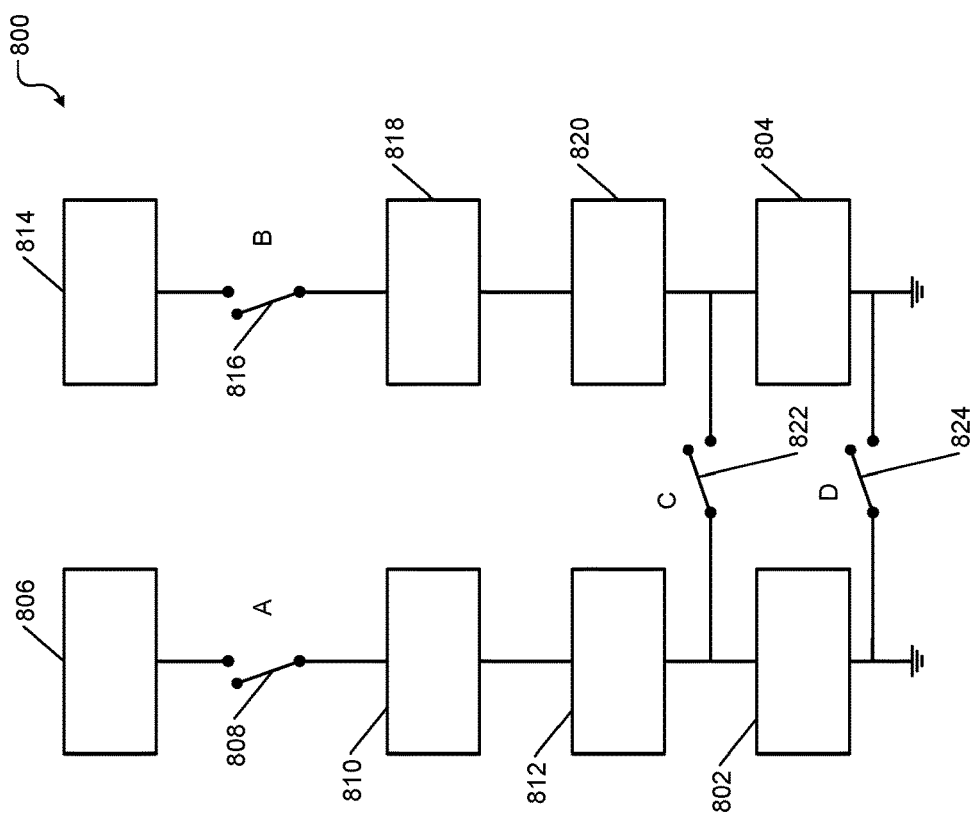
FIG. 8 shows an example implementation of the system of FIG. 6.

FIG. 8 shows an example of an electrical architecture of a system 800 that may be used by the fault mitigation module (e.g., element 260 shown in FIG. 2B) for switching power source in redundant subsystems in the vehicle. The system 800 shows an example implementation of the system 600 shown and described with reference to FIG. 6 above.

For example, the system 800 comprises redundant subsystems A and B (called first and second subsystems below) respectively identified at 802 and 804, which can be similar to elements 602, 604 of the system 600. The first subsystem 802 is powered by a first power circuit comprising a power source A (called first power source below) 806, a first switch (shown as switch A) 808, a first fuse box 810, and a first connector 812. The second subsystem 804 is powered by a second power circuit comprising a power source B (called second power source below) 814, a second switch (shown as switch B) 816, a second fuse box 818, and a second connector 820.

The first power source 806 is connected to the first fuse box 810 via the first switch 808. The first fuse box 810 is connected to the first connector 812. The first connector 812 is connected to the first subsystem 802. Thus, the first subsystem 802 receives power from the first power source 806 via the first switch 808, the first fuse box 810, and the first connector 812. The elements 806, 808, 810, 812, and 802 may be connected using interconnecting cables. Any of the elements 806, 808, 810, and 812 of the first power circuit and their interconnecting cables can develop faults that are described above and that can be detected by the fault detection module using the method 400 described above.

The second power source 814 is connected to the second fuse box 818 via the second switch 816. The second fuse box 818 is connected to the second connector 820. The second connector 820 is connected to the second subsystem 804. Thus, the second subsystem 804 receives power from the second power source 814 via the second switch 816, the second fuse box 818, and the second connector 820. The elements 814, 816, 818, 820, and 804 may be connected using interconnecting cables. Any of the elements 814, 816, 818, and 820 of the second power circuit and their interconnecting cables can develop faults that are described above and that can be detected by the fault detection module using the method 400 described above.

The system 800 further comprises a third switch (shown as switch C) 822 and a fourth switch (shown as switch D) 824. A first end or terminal of the third switch 822 is connected between the first connector 812 and the first subsystem 802. A second end or terminal of the third switch 822 is connected between the second connector 820 and the second subsystem 804. A first end or terminal of the fourth switch 824 is connected between the first subsystem 802 and ground. A second end or terminal of the fourth switch 824 is connected between the second subsystem 804 and ground.

The first and second power sources 806, 814 can be similar to elements 614, 616 of the system 600 shown and described with reference to FIG. 6 above. The first fuse box 810 and the first connector 812 can be elements of the power distribution circuit 618 of the system 600. The second fuse box 818 and the second connector 820 can be elements of the power distribution circuit 620 of the system 600. The first through fourth switches 808, 816, 822, 824 can be elements of the fault mitigation module 630 of the system 600. Elements 806, 810, and 812 can be called a first power supply system; and elements 814, 818, and 820 can be called a second power supply system.

During normal operation (i.e., when both the first and second power supply systems are healthy as determined by the method 400), the first and second switches 808, 816 are closed, and the third and fourth switches 822, 824 are open. Thus, the first subsystem 802 is powered by the first power source 806, and the second subsystem 804 is powered by the second power source 814.

When the first or second power circuit develops a fault (as determined by the fault detection modules 610, 612 of the system 600 using the method 400), the fault mitigation module 630 of the system 600 mitigates the fault as follows. The first switch 808 or the second switch 816 is opened. For example, if the first power circuit it faulty, the first switch 808 is opened; or if the second power circuit is faulty, the second switch 816 is opened. The third and fourth switches 822 and 824 are closed.

Thus, only one of first and second power sources 806, 814 (or only one of the first and second power supply systems) that is not faulty supplies power to the redundant first and second subsystems 802, 804. The first through fourth switches 808, 810, 822, and 824 are operated as described above by the fault mitigation module 630 of the system 600 using the method 500. Further, the reduction in power consumption by the redundant first and second subsystems 802, 804 is controlled by the fault mitigation module 630 of the system 600 using the method 500.

Figure 9:
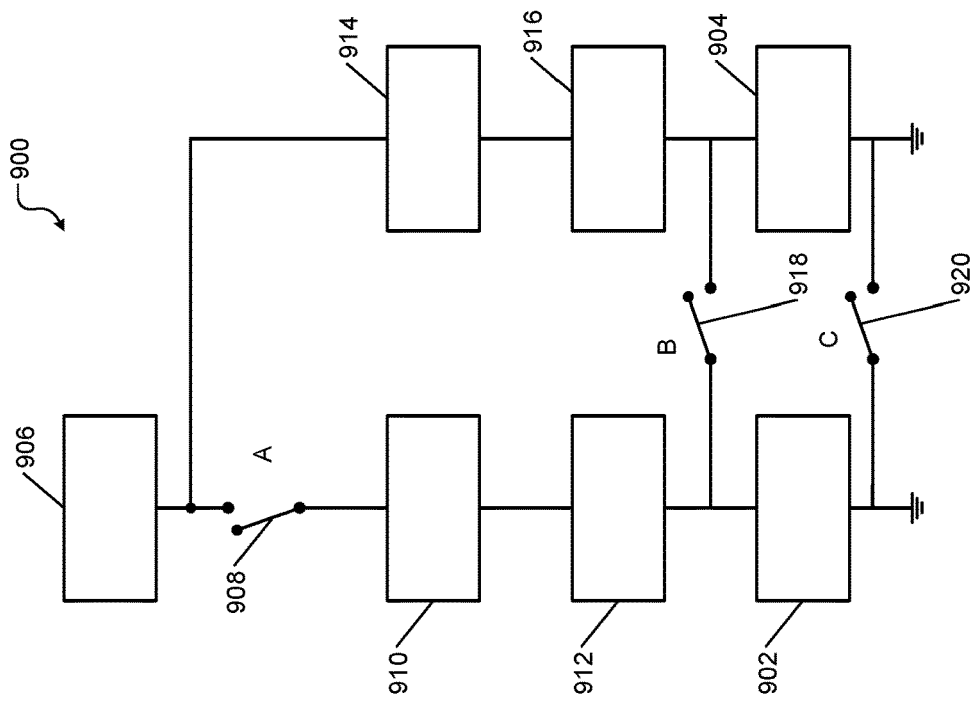
FIG. 9 shows an example implementation of the system of FIG. 7.

FIG. 9 shows an example of an electrical architecture of a system 900 that may be used by the fault mitigation module (e.g., element 210 shown in FIG. 2A) for switching/sharing power between two subsystems that are powered by a single power source. The system 900 shows an example implementation of the system 700 shown and described with reference to FIG. 7 above.

For example, the system 900 comprises two subsystems A and B (called first and second subsystems below) respectively identified at 902 and 904, which can be similar to elements 702, 704 of the system 700. The first and second subsystems 902 and 904 are powered by a power source 906. The first subsystem 902 is powered by a first power circuit comprising the power source 906, a first switch (shown as switch A) 908, a first fuse box 910, and a first connector 912. The second subsystem 904 is powered by a second power circuit comprising the power source 906, a second fuse box 914, and a second connector 916.

The power source 906 is connected to the first fuse box 910 via the first switch 908. The first fuse box 910 is connected to the first connector 912. The first connector 912 is connected to the first subsystem 902. Thus, the first subsystem 902 receives power from the power source 906 via the first switch 908, the first fuse box 910, and the first connector 912. The elements 906, 908, 910, 912, and 902 may be connected using interconnecting cables. Any of the elements 906, 908, 910, and 912 of the first power circuit and their interconnecting cables can develop faults that are described above and that can be detected by the fault detection module using the method 400 described above.

The power source 906 is directly connected to the second fuse box 914. The second fuse box 914 is connected to the second connector 916. The second connector 916 is connected to the second subsystem 904. Thus, the second subsystem 904 receives power from the power source 906 via the second fuse box 916 and the second connector 918. The elements 906, 916, 916, and 904 may be connected using interconnecting cables. Any of the elements 906, 916, and 916 of the second power circuit and their interconnecting cables can develop faults that are described above and that can be detected by the fault detection module using the method 400 described above.

The system 900 further comprises a second switch (shown as switch B) 918 and a third switch (shown as switch C) 920. A first end or terminal of the second switch 918 is connected between the first connector 912 and the first subsystem 902. A second end or terminal of the second switch 918 is connected between the second connector 916 and the second subsystem 904. A first end or terminal of the third switch 920 is connected between the first subsystem 902 and ground. A second end or terminal of the third switch 920 is connected between the second subsystem 904 and ground.

The power source 906 can be similar to element 714 of the system 700 shown and described with reference to FIG. 7 above. The first fuse box 910 and the first connector 912 can be elements of the power distribution circuit 718 of the system 700. The second fuse box 914 and the second connector 916 can be elements of the power distribution circuit 720 of the system 700. The first through third switches 908, 918, 920 can be elements of the fault mitigation module 730 of the system 700.

During normal operation (i.e., when the power source 906 and elements 910, 912 are healthy as determined by the method 400), the first switch 908 is closed, and the second and third switches 918, 920 are open. Thus, the first and second subsystems 902, 904 are powered by the power source 906.

When the first power circuit develops a fault (as determined by the fault detection module using the method 400), the fault mitigation module 730 of the system 700 mitigates the fault as follows. The first switch 908 is opened. The third and fourth switches 822 and 824 are closed. Thus, the second power circuit that is not faulty supplies power to the first and second subsystems 902, 904. The first through third switches 908, 918, and 920 are operated as described above by the fault mitigation module 730 of the system 700 using the method 500. Further, the reduction in power consumption by the first and second subsystems 902, 904 is controlled by the fault mitigation module 730 of the system 700 using the method 500.

In sum, broadly speaking, a system according to the present disclosure comprises a fault detection module and a fault mitigation module. The fault detection module is configured to communicate with a power circuit supplying power to a subsystem of a vehicle. The power circuit comprises a power source and a plurality components that connect the power source to the subsystem. The fault detection module is configured to distinguish between a first fault caused by a failure of the power source from a second fault caused by one of the plurality of components of the power circuit. The fault mitigation module is configured to mitigate the first fault differently than the second fault.

Further, a method according to the present disclosure comprises determining whether a fault associated with a power circuit supplying power to a subsystem of a vehicle is due to a power source in the power circuit supplying power to a subsystem of a vehicle or due to one of a plurality components of the power circuit that connect the power source to the subsystem of the vehicle. The method further comprises mitigating the fault differently when the fault is caused by a failure of the power source than when the fault is caused by a failure of one of the plurality components of the power circuit.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
a fault detection module configured to:
communicate with a power circuit supplying power to a subsystem of a vehicle, wherein the power circuit comprises a power source and a plurality components that connect the power source to the subsystem;
receive N sets of measurements from the power circuit and the subsystem, where N is an integer greater than 1, and wherein each set of the N sets includes voltages at an output of the power source and at an input of the subsystem;
detect a first fault indicating a power source failure based on the voltage at the output of the power source;
detect a second fault indicating a permanent disconnection of one of the components from the power source based on a difference between the voltages at the output of the power source and at the input of the subsystem being greater than a first threshold for all the N sets; and
detect a third fault indicating an intermittent disconnection of one of the components from the power source based on the difference being greater than a second threshold for M of the N sets, where 1≤M<N; and
a fault mitigation module configured to:
mitigate the first and second faults by switching to a different power source in the vehicle to supply power to the subsystem; and
mitigate the third fault by reducing the power consumed by the subsystem and by generating a warning regarding the intermittent disconnection.

2. The system of claim 1 wherein each set of the N sets further includes current drawn by the subsystem from the power source and wherein:
the fault detection module is configured to:
receive a measurement of a parameter associated with at least one of the power circuit and the subsystem, wherein the parameter is different than the voltages and current;
determine a resistance of the power circuit based on the voltages and current;
normalize the resistance based on the parameter; and
detect, based on the normalized resistance, a fourth fault indicating a loose connection between the power circuit and the subsystem or indicating corrosion of one of the components; and
the fault mitigation module is configured to:
mitigate the fourth fault by reducing the power consumed by the subsystem and by generating a warning regarding the loose connection or corrosion.

3. The system of claim 1 wherein the fault detection module is further configured to:
 receive data regarding at least one of an output current and a state of health of the power source; and
 detect the first fault faster based on the data than based on the voltage at the output of the power source.

4. The system of claim 1 further comprising:
 a second fault detection module configured to communicate with a second power circuit supplying power to a second subsystem of the vehicle, wherein the second power circuit comprises a second power source and a plurality of second components that connect the second power source to the second subsystem;
 wherein the fault mitigation module is configured to, in response to the second fault detection module detecting no fault in the second power circuit, and in response to the fault detection module detecting the first, second, or third fault:
  mitigate the first, second, or third fault by switching the subsystem to receive power from the second power circuit.

5. The system of claim 1 further comprising:
 a second fault detection module configured to:
  communicate with a second power circuit supplying power to a second subsystem of the vehicle, wherein the second power circuit comprises a second power source and a plurality of second components that connect the second power source to the second subsystem; and
  detect a fourth fault indicating a loose connection between the second power circuit and the second subsystem or indicating corrosion of one of the second components;
 wherein the fault mitigation module is configured to, in response to the second fault detection module detecting the fourth fault, and in response to the fault detection module detecting the first, second, or third fault:
  mitigate the first, second, or third fault and mitigate the fourth fault by switching the subsystem to receive power from the second power circuit, by reducing the power consumed by the subsystem, and by generating a warning regarding the loose connection between the second power circuit and the second subsystem or regarding corrosion of one of the second components.

6. The system of claim 1 further comprising:
 a second fault detection module configured to:
  communicate with a second power circuit supplying power to a second subsystem of the vehicle, wherein the second power circuit comprises a second power source and a plurality of second components that connect the second power source to the second subsystem; and
  detect a fourth fault indicating a second power source failure, a permanent disconnection between the second power circuit and the second subsystem, or an intermittent disconnection between the second power circuit and the second subsystem;
 wherein the fault mitigation module is configured to, in response to the second fault detection module detecting the fourth fault, and in response to the fault detection module detecting the first, second, or third fault:
  mitigate the first, second, or third fault and mitigate the fourth fault by switching the subsystem or the second subsystem to receive power from a third power source in the vehicle.

7. The system of claim 1 further comprising:
 a second fault detection module configured to:
  communicate with a second power circuit supplying power to a second subsystem of the vehicle, wherein the second power circuit comprises a second power source and a plurality of second components that connect the second power source to the second subsystem; and
  detect a fourth fault indicating a second power source failure, a permanent disconnection between the second power circuit and the second subsystem, or an intermittent disconnection between the second power circuit and the second subsystem;
 wherein the fault mitigation module is configured to, in response to the second fault detection module detecting the fourth fault, and in response to the fault detection module detecting the first, second, or third fault:
  mitigate the first, second, or third fault and mitigate the fourth fault by switching operation of the vehicle to a third subsystem and using the third subsystem to pullover the vehicle to roadside.

8. The system of claim 2 further comprising:
 a second fault detection module configured to:
  communicate with a second power circuit supplying power to a second subsystem of the vehicle, wherein the second power circuit comprises a second power source and a plurality of second components that connect the second power source to the second subsystem; and
  detect a fifth fault indicating a loose connection between the second power circuit and the second subsystem or indicating corrosion of one of the second components;
 wherein the fault mitigation module is configured to:
  in response to the second fault detection module detecting no fault in the second power circuit and in response to the fault detection module detecting the fourth fault, or
  in response to the second fault detection module detecting the fifth fault and the fault detection module detecting the fourth fault:
   mitigate at least one of the fourth and fifth faults by reducing the power consumed by at least one of the subsystem and the second subsystem and by generating a warning regarding the loose connection or corrosion associated with at least one of the subsystem and the second subsystem.

9. The system of claim 2 further comprising:
 a plurality of voltage sensors configured to sense the voltages;
 a current sensor configured to sense the current; and
 a validation module configured to determine whether values of the voltages and current in each set are valid;
 wherein the fault detection module is configured to:
  determine whether one or more of the voltage and current sensors are faulty based on determining whether the values of the voltages and current in each set are valid; and
  detect the first, second, third, or fourth fault in response to determining that the values of the voltages and current in each set are valid.

10. The system of claim 2 wherein the parameter includes at least one of temperature and humidity associated with at least one of the power circuit and the subsystem.

11. A method comprising:
 receiving N sets of measurements from a power circuit comprising a power source supplying power via a plurality of components to a subsystem of a vehicle, where N is an integer greater than 1, and wherein each set of the N sets includes voltages at an output of the power source and at an input of the subsystem;
detecting a first fault indicating a power source failure based on the voltage at the output of the power source;
detecting a second fault indicating a permanent disconnection of one of the components from the power source based on a difference between the voltages at the output of the power source and at the input of the subsystem being greater than a first threshold for all the N sets;
detecting a third fault indicating an intermittent disconnection of one of the components from the power source based on the difference being greater than a second threshold for M of the N sets, where $1 \leq M < N$;
mitigating the first and second faults by switching to a different power source in the vehicle to supply power to the subsystem; and
mitigating the third fault by reducing the power consumed by the subsystem and by generating a warning regarding the intermittent disconnection.

12. The method of claim 11 wherein each set of the N sets further includes current drawn by the subsystem from the power source, the method further comprising:
receiving a measurement of a parameter associated with at least one of the power circuit and the subsystem, wherein the parameter is different than the voltages and current;
determining a resistance of the power circuit based on the voltages and current;
normalizing the resistance based on the parameter;
detecting, based on the normalized resistance, a fourth fault indicating a loose connection between the power circuit and the subsystem or indicating corrosion of one of the components; and
mitigating the fourth fault by reducing the power consumed by the subsystem and by generating a warning regarding the loose connection or corrosion.

13. The method of claim 11 further comprising:
receiving data regarding at least one of an output current and a state of health of the power source; and
detecting the first fault faster based on the data than based on the voltage at the output of the power source.

14. The method of claim 11 further comprising:
communicating with a second power circuit comprising a second power source supplying power via a plurality of second components to a second subsystem of the vehicle; and
in response to detecting no fault in the second power circuit, and in response to detecting the first, second, or third fault:
mitigating the first, second, or third fault by switching the subsystem to receive power from the second power circuit.

15. The method of claim 11 further comprising:
communicating with a second power circuit comprising a second power source supplying power via a plurality of second components to a second subsystem of the vehicle;
detecting a fourth fault indicating a loose connection between the second power circuit and the second subsystem or indicating corrosion of one of the second components; and
in response to detecting the fourth fault, and in response to detecting the first, second, or third fault:
mitigating the first, second, or third fault and mitigate the fourth fault by switching the subsystem to receive power from the second power circuit, by reducing the power consumed by the subsystem, and by generating a warning regarding the loose connection between the second power circuit and the second subsystem or regarding corrosion of one of the second components.

16. The method of claim 11 further comprising:
communicating with a second power circuit comprising a second power source supplying power via a plurality of second components to a second subsystem of the vehicle;
detecting a fourth fault indicating a second power source failure, a permanent disconnection between the second power circuit and the second subsystem, or an intermittent disconnection between the second power circuit and the second subsystem; and
in response to detecting the fourth fault, and in response to detecting the first, second, or third fault:
mitigating the first, second, or third fault and mitigate the fourth fault by switching the subsystem or the second subsystem to receive power from a third power source in the vehicle.

17. The method of claim 11 further comprising:
communicating with a second power circuit comprising a second power source supplying power via a plurality of second components to a second subsystem of the vehicle;
detecting a fourth fault indicating a second power source failure, a permanent disconnection between the second power circuit and the second subsystem, or an intermittent disconnection between the second power circuit and the second subsystem; and
in response to detecting the fourth fault, and in response to detecting the first, second, or third fault:
mitigating the first, second, or third fault and mitigate the fourth fault by switching operation of the vehicle to a third subsystem and using the third subsystem to pull-over the vehicle to roadside.

18. The method of claim 12 further comprising:
communicating with a second power circuit comprising a second power source supplying power via a plurality of second components to a second subsystem of the vehicle;
detecting a fifth fault indicating a loose connection between the second power circuit and the second subsystem or indicating corrosion of one of the second components; and
in response to detecting no fault in the second power circuit and in response to detecting the fourth fault, or
in response to detecting the fifth fault and detecting the fourth fault:
mitigating at least one of the fourth and fifth faults by reducing the power consumed by at least one of the subsystem and the second subsystem and by generating a warning regarding the loose connection or corrosion associated with at least one of the subsystem and the second subsystem.

19. The method of claim 12 further comprising:
determining whether values of the voltages and current in each set are valid;
determining whether one or more of the voltage and current sensors are faulty based on determining whether the values of the voltages and current in each set are valid; and
detecting the first, second, third, or fourth fault in response to determining that the values of the voltages and current in each set are valid.

20. The method of claim 12 wherein the parameter includes at least one of temperature and humidity associated with at least one of the power circuit and the subsystem.

\* \* \* \* \*